United States Patent
Nogami et al.

(10) Patent No.: US 8,841,212 B2
(45) Date of Patent: Sep. 23, 2014

(54) METHOD OF MAKING A COPPER INTERCONNECT HAVING A BARRIER LINER OF MULTIPLE METAL LAYERS

(75) Inventors: Takeshi Nogami, Shchenectady, NY (US); Thomas M. Shaw, Peekskill, NY (US); Andrew H. Simon, Fishkill, NY (US); Jean E. Wynne, Fair Haven, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/609,668

(22) Filed: Sep. 11, 2012

(65) Prior Publication Data
US 2013/0005137 A1    Jan. 3, 2013

Related U.S. Application Data

(62) Division of application No. 12/013,649, filed on Jan. 14, 2008.

(51) Int. Cl.
*H01L 21/4763* (2006.01)
*H01L 21/768* (2006.01)
*H01L 23/532* (2006.01)

(52) U.S. Cl.
CPC .... *H01L 23/53238* (2013.01); *H01L 21/76846* (2013.01); *H01L 21/76844* (2013.01)
USPC ........... 438/648; 438/650; 438/653; 438/654; 438/687; 257/E21.586

(58) Field of Classification Search
USPC ......... 438/622, 687, 642–644, 648, 650, 672, 438/653, 654; 257/E21.586
See application file for complete search history.

(56) References Cited

U.S. PATENT DOCUMENTS

| | | |
|---|---|---|
| 5,933,753 A | 8/1999 | Simon et al. |
| 6,242,349 B1 | 6/2001 | Nogami et al. |
| 6,627,542 B1 | 9/2003 | Gandikota et al. |
| 6,656,841 B1 | 12/2003 | Kim |

(Continued)

FOREIGN PATENT DOCUMENTS

CN    1476089    2/2004

OTHER PUBLICATIONS

U.S.P.T.O. Office Action Communication, U.S. Appl. No. 12/013,649, pp. 1-7, Dated Jul. 9, 2009.

(Continued)

*Primary Examiner* — Anh Mai
(74) *Attorney, Agent, or Firm* — Gibb & Riley, LLC; Catherine Ivers, Esq.

(57) ABSTRACT

A method patterns at least one opening in a low-K insulator layer of a multi-level integrated circuit structure, such that a copper conductor is exposed at the bottom of the opening. The method then lines the sidewalls and the bottom of the opening with a first Tantalum Nitride layer in a first chamber and forms a Tantalum layer on the first Tantalum Nitride layer in the first chamber. Next, sputter etching on the opening is performed in the first chamber, so as to expose the conductor at the bottom of the opening. A second Tantalum Nitride layer is formed on the conductor, the Tantalum layer, and the first Tantalum Nitride layer, again in the first chamber. After the second Tantalum Nitride layer is formed, the methods herein form a flash layer comprising a Platinum group metal on the second Tantalum Nitride layer in a second, different chamber.

10 Claims, 4 Drawing Sheets

(56) References Cited

U.S. PATENT DOCUMENTS

| | | |
|---|---|---|
| 6,768,203 B1 | 7/2004 | Simon et al. |
| 6,911,229 B2 | 6/2005 | Andricacos et al. |
| 6,953,742 B2 | 10/2005 | Chen et al. |
| 6,992,390 B2 | 1/2006 | Edelstein et al. |
| 7,215,006 B2 | 5/2007 | Yang et al. |
| 7,528,066 B2 | 5/2009 | Yang et al. |
| 2005/0112864 A1 | 5/2005 | Clevenger et al. |
| 2005/0118796 A1 | 6/2005 | Chiras et al. |
| 2006/0081986 A1 | 4/2006 | Clevenger et al. |
| 2009/0194876 A1 | 8/2009 | Yang et al. |

OTHER PUBLICATIONS

U.S.P.T.O. Office Action Communication, U.S. Appl. No. 12/013,649, pp. 1-12, Dated Sep. 28, 2009.

U.S.P.T.O. Office Action Communication, U.S. Appl. No. 12/013,649, pp. 1-10, Dated Mar. 26, 2010.

U.S.P.T.O. Office Action Communication, U.S. Appl. No. 12/013,649, pp. 1-3, Dated Apr. 26, 2010.

U.S.P.T.O. Office Action Communication, U.S. Appl. No. 12/013,649, pp. 1-8, Dated May 24, 2010.

U.S.P.T.O. Office Action Communication, U.S. Appl. No. 12/013,649, pp. 1-8, Dated Sep. 20, 2010.

U.S.P.T.O. Office Action Communication, U.S. Appl. No. 12/013,649, pp. 1-3, Dated Nov. 29, 2010.

U.S.P.T.O. Office Action Communication, U.S. Appl. No. 12/013,649, pp. 1-2, Dated Feb. 15, 2011.

U.S.P.T.O. Office Action Communication, U.S. Appl. No. 12/013,649, pp. 1-12, Dated Jul. 8, 2011.

Quirk, Michael, et al.—Semiconductor Manufacturing Technology Instructor's Manual—Published by Prentice Hall—Oct. 2011—Chinese Technology Magazines translated it in Chinese and published on Jan. 31, 2004.

Office Action Communication, U.S. Appl. No. 12/013,649, Board's Decision dated Apr. 10, 2014, pp. 1-8.

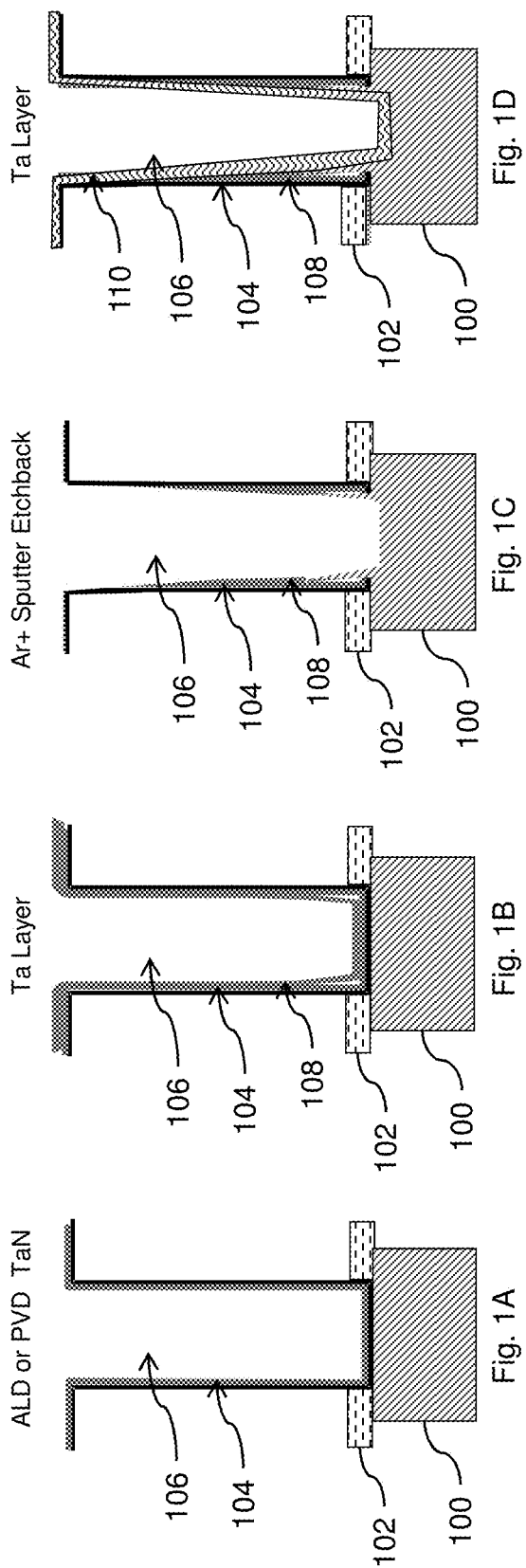

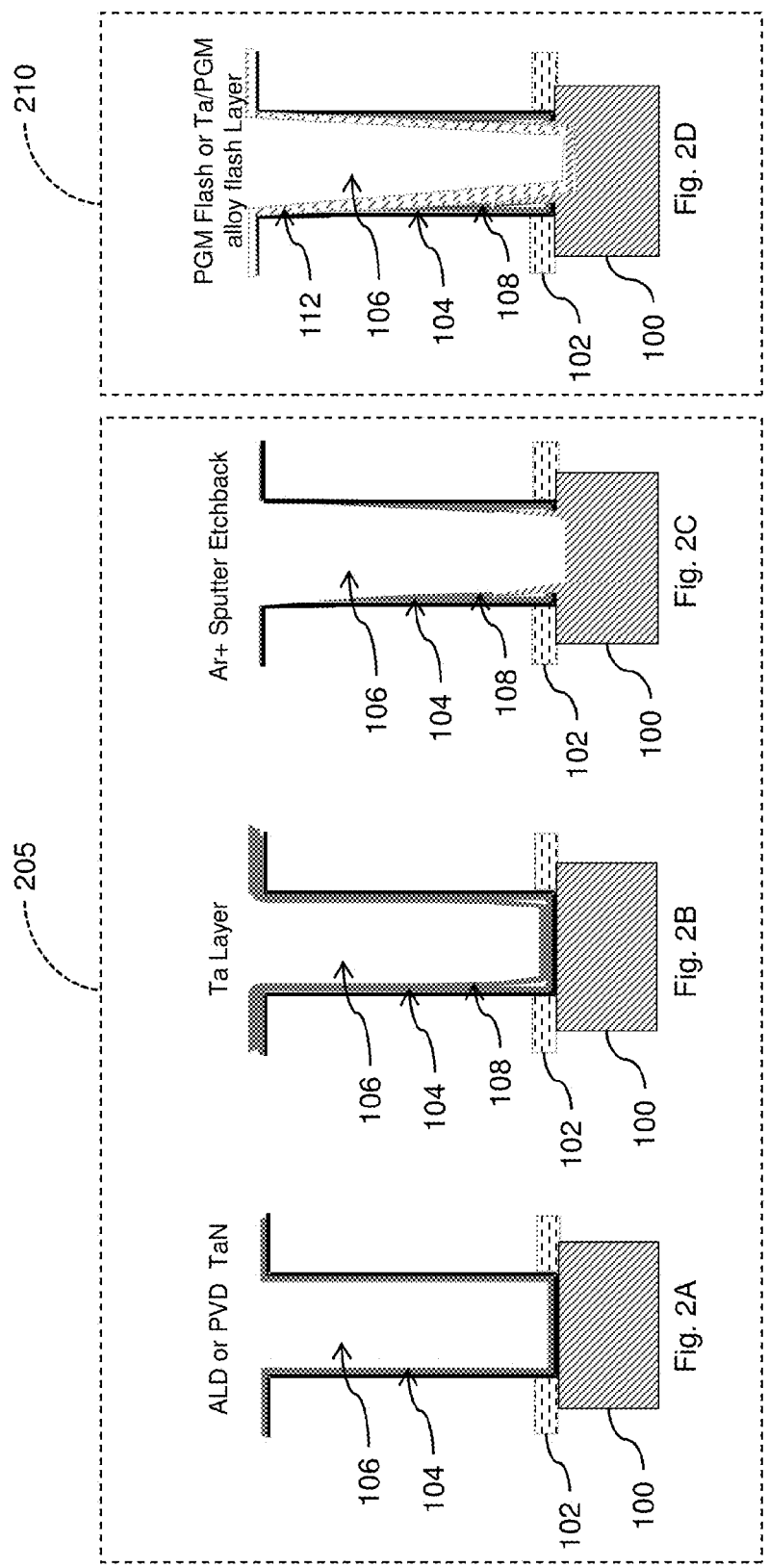

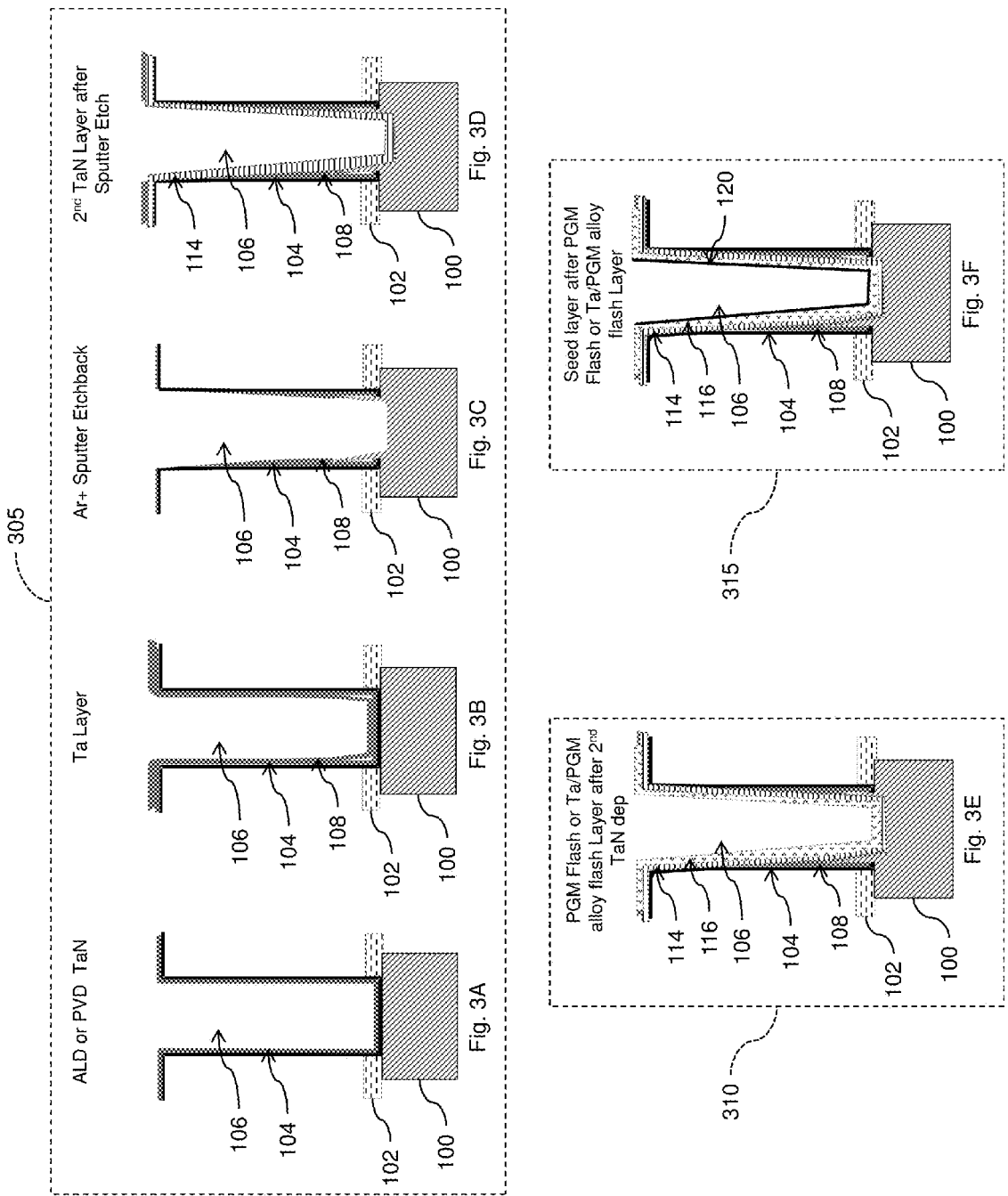

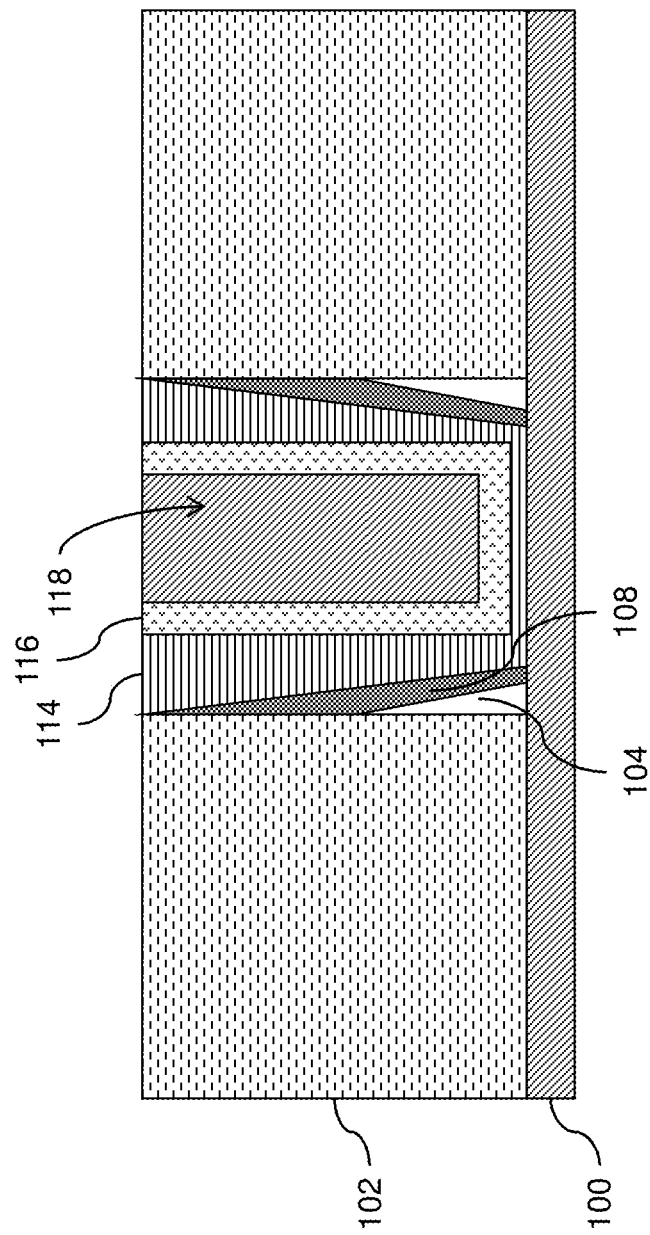

8,841,212 B2

METHOD OF MAKING A COPPER INTERCONNECT HAVING A BARRIER LINER OF MULTIPLE METAL LAYERS

CROSS-REFERENCE TO RELATED APPLICATIONS

This application is a Divisional of U.S. application Ser. No. 12/013,649 filed Jan. 14, 2008, the complete disclosure of which, in its entirety, is herein incorporated by reference.

BACKGROUND AND SUMMARY

This invention is generally related to forming connections between layers in a semiconductor structure, and more particularly to an improved conductive via formation technique that utilizes a Platinum group metal or alloy on a second Tantalum Nitride layer within the via opening.

Copper interconnect technology is running up against significant limitations in satisfying conflicting demands of good Copper full quality, current redundancy in the liner metal, good barrier properties against Copper diffusion (particularly with respect to integration with low-K dielectrics), and cost-effectiveness, manufacturability and compatibility with proven deposition technologies.

To address these issues, the embodiments of the invention provide a method that patterns at least one opening in a low-K insulator layer of a multi-level integrated circuit structure, such that a copper conductor is exposed at the bottom of the opening. The method then lines the sidewalls and the bottom of the opening with a first Tantalum Nitride layer in a first chamber and forms a Tantalum layer on the first Tantalum Nitride layer in the first chamber.

Next, sputter etching on the opening is performed in the first chamber, so as to expose the conductor at the bottom of the opening. The sputter etching can comprise, for example, an Argon sputter etchback. The sputter etching leaves a portion of the first Tantalum Nitride layer and a portion of the Tantalum layer on the sidewalls of the opening. While the structure is still in the first chamber, a second Tantalum Nitride layer is formed on the conductor, the sidewalls, and on the remaining portions of the Tantalum layer and the first Tantalum Nitride layer.

After the second Tantalum Nitride layer is formed, the methods herein move the structure to a different chamber (second chamber) and form a flash layer comprising a Platinum group metal on the second Tantalum Nitride layer. The Platinum group metal comprises at least one of: Ruthenium, Rhodium, Palladium, Osmium, Iridium, and Platinum. After this processing, the structure can be moved to a third chamber where copper is deposited, or seeded, on the flash layer in the opening until the opening is coated with a copper seed layer in the third chamber. After the deposition of the copper seed layer, the wafer would then be removed from the vacuum system and electroplated with copper so as to fully fill the via and line structures with copper. The plasma vapor deposition (PVD) seed layer followed by electroplating of the copper metals creates an electrical connection between the conductor and a second conductor on an opposite side of the insulator layer.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIGS. 1A-1D are cross-sectional schematic diagrams of a partially completed conductive via;

FIGS. 2A-2D are cross-sectional schematic diagrams of a partially completed conductive via;

FIGS. 3A-3F are cross-sectional schematic diagrams of a partially completed conductive via; and FIG. 4 is a cross-sectional schematic diagram of a conductive via.

DETAILED DESCRIPTION OF EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

A standard Tantalum Nitride/Tantalum/etchback/Tantalum liner barrier sequence has been described in the literature (see, e.g., N. Kumar, et al., AMC 2004 Proceedings) and is widely used in the industry. This sequence provides good barrier properties and good reliability in standard electromigration (EM), stress migration (SM) type reliability tests. This type of source technology has been developed for over a decade, which has enabled certain key capabilities such as high-ionization for feature coverage, in-situ heavy Argon (Ar+) etchback for Tantalum Nitride/Tantalum redistribution and via-bottom etching, etc.

However, this barrier sequence is facing limitations in that the interfacial layer next to the Copper seed/fill material is Tantalum. Tantalum is inferior in Copper wettability to other candidate materials, specifically Ruthenium and other platinum-group metals (PGM's) such as Iridium, etc. The downsides of using Ruthenium as a barrier metal are poor diffusion barrier properties, even in nitrided form and extremely high raw material cost. Further, there exists limited sputter-technology infrastructure in which PGM's can be used as target materials.

The "punch-thru" process needed to anchor vias for good testing tends to leave exposed dielectric on the top corners of trench and via structures, leading to a risk of Copper diffusion into low-K dielectrics (e.g., those with a dielectric constant below 4.0). Therefore, embodiments herein use the superior barrier properties of Tantalum, or Tantalum Nitride in place at those points on the structure. More specifically, this disclosure describes a process sequence involving a combination of proven Tantalum(N) deposition/in-situ etch chamber technology and Tantalum/platinum group metal (PGM) alloy, or a pure PGM-only layer deposition so as to maximize the benefits of both, and to exploit the capabilities of PGM's as liners in advanced Copper interconnects.

Thus, this disclosure describes a process sequence involving an advanced Tantalum(N) deposition/in-situ in a first etch chamber, and a second chamber that incorporates either a Tantalum/platinum group metal (PGM) alloy or a purely PGM-only layer, either as a physical vapor deposition (PVD); chemical vapor deposition (CVD); or atomic layer deposition (ALD). Subsequent processing after the barrier sequence can also involve a Copper seedlayer deposition in the same vacuum tooling cluster. The second Tantalum Nitride layer deposition after the etchback in the Tantalum(N) chamber enables the superior barrier properties of the Tantalum Nitride barrier to be exploited at all points along the structure's dielectric/metal interface without having to rely on the compromised barrier properties of PGM or Tantalum/PGM alloys.

This two-chamber process combines the superior barrier properties and deposition/etch capabilities of commercially available Tantalum(N) advanced sources while exploiting the improved wettability of the Tantalum/PGM alloy or PGM flash layer, without requiring the compromised barrier properties or high-cost, and development complexity of a PGM or Tantalum/PGM alloy PVD deposition/etching source technology.

Referring now to the drawings, and more particularly to FIGS. 1A-1D, a first process flow is shown of a deposition/etching sequence of Tantalum Nitride/Tantalum/Ar Etch/Tantalum that is used in the formation of modern Copper interconnects. More specifically, in FIG. 1A, at least one opening 106 is patterned in a low-K insulator layer 102 of a multi-level integrated circuit structure, such that an underlying conductor 100 (e.g., copper) is exposed at the bottom of the opening 106. The method then lines the sidewalls and the bottom of the opening 106 with a first Tantalum Nitride layer 104. In one example, the Tantalum Nitride layer can be deposited using a PVD Tantalum chamber, although the initial Tantalum Nitride layer could be deposited by any other commonly available processes, such as ALD, CVD, etc.

In FIG. 1B, a Tantalum layer 108 is formed on the Tantalum Nitride layer 104, using any similar deposition process. In FIG. 1C, sputter etching on the opening 106 is performed in the first chamber, so as to expose the conductor 100 at the bottom of the opening 106. Then, another Tantalum layer 110 is deposited in the opening 106, as shown in FIG. 1D, prior to filling the opening 106 with a conductor.

One possible alternative to the processing shown in FIGS. 1A-1D is shown in FIGS. 2A-2D. The processing shown in FIGS. 2A-2C is substantially similar to the processing shown in FIGS. 1A-1C. Therefore, as shown in FIGS. 2A-2C, the barrier/liner sequence starts with the Tantalum Nitride/Tantalum/Etchback process in the Tantalum/Tantalum Nitride chamber 205; however, in FIG. 2D, the processing then moves to a second chamber 210 where a pure PGM layer or PGM/Tantalum alloy layer 112 is deposited to ensure optimum wettability of the Copper fill material. The second layer of PGM or PGM/Tantalum alloy 112 could be deposited using a PVD, ALD or CVD process.

One issue with the processing shown in FIGS. 2A-2D is that inferior barrier properties of PGM/PGM-Tantalum alloys cause vulnerability to Copper diffusion into the dielectric at the top corners of trenches or vias. This vulnerability could be present anywhere there is bare dielectric present after the etching process.

FIGS. 3A-3F illustrate an embodiment that offers a solution to the problem of poor diffusion-barrier properties of the PGM or Tantalum-PGM alloy as the final liner/barrier layer. Again, the processing in FIGS. 3A-3C is substantially similar to the processing in FIGS. 1A-1C and 2A-2C. However, rather than depositing Tantalum, as was done in FIG. 1D, the embodiment shown in FIG. 3D forms a second layer of Tantalum Nitride, while in the first chamber 305. Therefore, this embodiment begins with a Tantalum Nitride/Tantalum/etchback/Tantalum Nitride process.

In FIG. 3D, the Tantalum Nitride could be deposited using advanced PVD, or though other methods such as ALD or CVD if tooling and film properties are acceptable. Layer thicknesses could be any appropriate thickness such as, for example, 10 A to 500 A for Tantalum Nitride and Tantalum (depending on feature dimensions and requirements).

Then, the structure is moved to a different second processing chamber 310, as shown in FIG. 3E. The second chamber 310 is different from the first chamber 305 and is designed for PGM or PGM-Tantalum alloy processing. As above, layer thicknesses could be any appropriate thickness (e.g., from 10 A to 500 A depending on requirements), with the PGM or PGM-alloy deposition being done by PVD, ALD or CVD.

Thus, as shown in FIG. 3A-3F, this embodiment provides a method that patterns at least one opening 106 in a low-K insulator layer of a multi-level integrated circuit structure, such that a copper conductor 100 is exposed at the bottom of the opening 106. The method then lines the sidewalls and the bottom of the opening 106 with a first Tantalum Nitride layer 104 in a first chamber 305 and forms a Tantalum layer 108 on the first Tantalum Nitride layer 104 in the first chamber.

Next, sputter etching on the opening 106 is performed in the first chamber 305, so as to expose the conductor 100 at the bottom of the opening 106. The sputter etching can comprise, for example, an Argon sputter etchback. The sputter etching leaves a portion of the first Tantalum Nitride layer 104 and a portion of the Tantalum layer 108 on the sidewalls of the opening 106. While the structure is still in the first chamber 305, a second Tantalum Nitride layer 114 is formed on the conductor, and on the remaining portions of the Tantalum layer 108 and the first Tantalum Nitride layer 104.

After the second Tantalum Nitride layer 114 is formed, the methods herein move the structure to a different chamber (second chamber 310) and form a flash layer 116 comprising a Platinum group metal on the second Tantalum Nitride layer 114. The Platinum group metal comprises at least one of: Ruthenium, Rhodium, Palladium, Osmium, Iridium, and Platinum and any alloy thereof. After this processing, the structure can be moved to a third chamber 315 where a copper seed layer 120 (50 A to 5000 A) is deposited on the flash layer 116 in the opening 106, as shown in FIG. 3F, until the opening 106 is fully coated with copper.

FIG. 4 illustrates the final structure in schematic form, after barrier and seed layer depositions and electroplating with copper. Therefore, FIG. 4 illustrates the underlying conductor 100, the low-K insulator layer 102, the first Tantalum Nitride layer 104, the Tantalum layer 108, the second Tantalum Nitride layer 114, the PGM or PGM Tantalum alloy flash layer 116, and a copper via conductor 118. The copper via conductor 118 creates an electrical connection between the underlying conductor 100 and a second conductor on an opposite side of the insulator layer 102, above the insulator layer 102. Note that FIG. 4 is not drawn to scale (for clarity purposes only) and the Tantalum, Tantalum Nitride, and PGM layers would be different thicknesses and lengths, however their sizes are exaggerated in FIG. 4 to allow their positions to be more easily seen.

One feature of the invention is that the proven Tantalum Nitride/Tantalum/etchback PVD technology can still be used in conjunction with the PGM/PGM-alloy final liner layer. The deposition of a final Tantalum Nitride layer in the first chamber enables the PGM/PGM-alloy layer to be deposited on top of a solid Copper barrier so that barrier properties and Copper wettability are optimized and expensive PGM usage is minimized. Further Tantalum Nitride has superior copper diffusion characteristics when compared to PGM alone. Therefore, the underlying second Tantalum Nitride layer and the PGM alloy provide the wettability benefits of PGM along with the ability to prevent Copper diffusion provided by the Tantalum Nitride.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method comprising:
    patterning an opening in an insulator layer of a multi-level integrated circuit structure, exposing a conductor at a bottom of said opening;
    in a first processing chamber:
        lining sidewalls and said bottom of said opening with a first Tantalum Nitride layer;
        forming a Tantalum layer on said first Tantalum Nitride layer;
        sputter etching said opening to expose said conductor at said bottom of said opening;
        forming a second Tantalum Nitride layer on said conductor, said Tantalum layer, and said first Tantalum Nitride layer;
    moving said multi-level integrated circuit structure to a second processing chamber and forming a flash layer comprising a Platinum group metal alloy on said second Tantalum Nitride layer in said second chamber;
    moving said multi-level integrated circuit structure to a third processing chamber and depositing a copper seed layer on said flash layer in said opening until said flash layer is coated with copper in said third chamber; and
    filling said opening with copper using electroplating.

2. The method according to claim 1, said sputter etching comprising an Argon sputter etchback.

3. The method according to claim 1, wherein said sputter etching leaving a portion of said first Tantalum Nitride layer and a portion of said Tantalum layer on said sidewalls of said opening.

4. The method according to claim 1, said Platinum group metal alloy comprising one of: Ruthenium, Rhodium, Palladium, Osmium, Iridium, and Platinum.

5. The method according to claim 1, said copper seed layer having a thickness of 50 Å to 5000 Å.

6. A method comprising:
    patterning an opening in an insulator layer of a multi-level integrated circuit structure, exposing a conductor at a bottom of said opening;
    lining sidewalls and said bottom of said opening with a first Tantalum Nitride layer in a first chamber;
    forming a Tantalum layer on said first Tantalum Nitride layer in said first chamber;
    sputter etching said opening in said first chamber, exposing said conductor at said bottom of said opening;
    forming a second Tantalum Nitride layer on said conductor, said Tantalum layer, and said first Tantalum Nitride layer in said first chamber;
    forming a flash layer comprising a Platinum group metal on said second Tantalum Nitride layer in a second chamber;
    depositing a copper seed layer on said flash layer in said opening until said flash layer is coated with copper in a third chamber; and
    filling said opening with copper using electroplating wherein said first chamber, second chamber and third chamber are different chambers.

7. The method according to claim 6, said sputter etching comprising an Argon sputter etchback.

8. The method according to claim 6, wherein said sputter etching leaving a portion of said first Tantalum Nitride layer and a portion of said Tantalum layer on said sidewalls of said opening.

9. The method according to claim 6, wherein said Platinum group metal comprising one of: Ruthenium, Rhodium, Palladium, Osmium, Iridium, Platinum, and alloys thereof.

10. The method according to claim 6, said copper seed layer having a thickness of 50 Å to 5000 Å.

* * * * *